(12) United States Patent
Lyke

(10) Patent No.: US 7,102,387 B1
(45) Date of Patent: Sep. 5, 2006

(54) PERIODIC COMPUTATION STRUCTURE BASED ON 1-INPUT LOOKUP TABLES

(75) Inventor: James C. Lyke, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 91 days.

(21) Appl. No.: 11/007,143

(22) Filed: Dec. 8, 2004

(51) Int. Cl.
*H01L 25/00* (2006.01)
*H03K 19/177* (2006.01)
*H03K 19/173* (2006.01)
*G06F 7/38* (2006.01)

(52) U.S. Cl. .............. 326/41; 326/10; 326/37; 326/38; 326/39; 326/40; 326/47; 326/101

(58) Field of Classification Search ............ 326/1–136
See application file for complete search history.

(56) References Cited

U.S. PATENT DOCUMENTS

| 6,215,327 | B1* | 4/2001 | Lyke | 326/41 |
| 6,331,788 | B1* | 12/2001 | Lyke | 326/39 |
| 2004/0150422 | A1* | 8/2004 | Wong | 326/41 |
| 2005/0134308 | A1* | 6/2005 | Okada et al. | 326/39 |

* cited by examiner

*Primary Examiner*—Rexford Barnie
*Assistant Examiner*—Dylan White
(74) *Attorney, Agent, or Firm*—James M. Skorich

(57) ABSTRACT

A simplified implementation of molecular field programmable gate arrays described in U.S. Pat. No. 6,215,327 and U.S. Pat. No. 6,331,788, reducing the complexity in a tiled array template to that of a 1-input lookup table.

2 Claims, 16 Drawing Sheets

(a)   (b)   (c)   (d)

$V_{OH}=0.8$, $V_{OL}=0.15$, $V_{IH}=0.3$, $V_{IL}=0.25$
max noise margin for AND at r~2.64, for OR at r~0.275

| Left LUT | | Right LUT | | ab 00 | ab 01 | ab 10 | ab 11 | function |
|---|---|---|---|---|---|---|---|---|
| 0 | 0 | 0 | 0 | 0 | 0 | 0 | 0 | zero |
| 0 | 0 | 0 | 1 | 0 | 0 | 0 | 0 | zero |
| 0 | 0 | 1 | 0 | 0 | 0 | 0 | 0 | zero |
| 0 | 0 | 1 | 1 | 0 | 0 | 0 | 0 | zero |
| 0 | 1 | 0 | 0 | 0 | 0 | 0 | 0 | zero |
| 0 | 1 | 0 | 1 | 0 | 0 | 0 | 1 | ab |
| 0 | 1 | 1 | 0 | 0 | 0 | 0 | 0 | ab' |
| 0 | 1 | 1 | 1 | 0 | 0 | 0 | 0 | a (wire) |
| 1 | 0 | 0 | 0 | 0 | 0 | 0 | 0 | zero |
| 1 | 0 | 0 | 1 | 0 | 0 | 0 | 0 | a'b |
| 1 | 0 | 1 | 0 | 0 | 0 | 0 | 0 | a'b' |
| 1 | 0 | 1 | 1 | 0 | 0 | 0 | 0 | a' |
| 1 | 1 | 0 | 0 | 0 | 0 | 0 | 0 | zero |
| 1 | 1 | 0 | 1 | 0 | 0 | 0 | 0 | b (wire) |
| 1 | 1 | 1 | 0 | 0 | 0 | 0 | 0 | b' |
| 1 | 1 | 1 | 1 | 0 | 0 | 0 | 0 | one |

PERIODIC COMPUTATION STRUCTURE BASED ON 1-INPUT LOOKUP TABLES

STATEMENT OF GOVERNMENT INTEREST

The conditions under which this invention was made are such as to entitle the Government of the United States under paragraph l(a) of Executive Order 10096, as represented by the Secretary of the Air Force, to the entire right, title and interest therein, including foreign rights.

BACKGROUND

The invention relates to field programmable gate array circuits used in digital circuit design, and in particular, relates to a computational building block scaleable to a molecular level using a two terminal computation element based on a one-input lookup table with a series resistance. This is a further simplification of the molecular architectures disclosed in U.S. Pat. No. 6,215,327 and U.S. Pat. No. 6,331,788, and hereby incorporated by reference, both by the same inventor of the present invention.

The key concept introduced in the referenced patents is that by connecting together a feed-forward network of identical, elemental assemblies (referred to as lookup tables or LUTs), it is possible to form a field programmable gate array (FPGA) capable of computing any spatial Boolean function so long as the array is sufficiently large. Complex Boolean function expression is achieved by using simple building blocks with low interconnection demand (only nearest-neighbor connectivity is required) that are arranged in a completely periodic fashion.

It is believed that three requirements for molecular electronics are: (1) low interconnection demand, (2) defect tolerance, and (3) capable of manufacture through non-lithographic methods. In traditional integrated circuits built in silicon, these boundary conditions are desirable but not essential. Low interconnection demand, for example, is compensated for by having many levels of planar interconnections (i.e., increased interconnection supply). In traditional microelectronics, defect tolerance is removed as a requirement by having fabrication processes that achieve very low numbers of defects, such that the production of integrated circuits has a high enough yield to be economically tractable. Finally, the cornerstone of conventional integrated circuits is lithography, and it is inconceivable to the present industry to attempt to construct complex circuits without it. This is because, most fundamentally, it is lithography that defines deliberate and complex patterns of the diffusion zones that become transistors and the interconnection patterns that bring them together to form complex digital circuits. However, this plan does not work at molecular scales, since high-volume lithography of features at these vastly reduced scales is impossible, as we presently understand technology. Furthermore, the sheer density of molecular circuits compromises the notion of high availability of interconnections. In other words, very dense structures introduce a disproportionate demand for wiring, as established by the empirical relationship known as Rent's rule (W. E. Donath, "Placement and Average Interconnection Lengths of Computer Logic", IEEE Transactions on Circuits and Systems, volume CAS-26, number 4, pages 272–277, 1979.). Finally, it is envisioned that defect mechanisms will be abundant. Even if lithography and interconnection supply were not issues, the likely pervasiveness of defects would render most normal integrated circuit designs inoperative.

The '327 patent identified an alternative scheme. Its fundamental requirement was the existence of simple, programmable cells, which upon arranging a number of them into a planar or 3-D array, could yield complex behaviors. In fact, the invention was the basis of perhaps the simplest conceivable FPGA, which could be harnessed to implement very complex circuits by programming each site as required after assembly so that the ensemble produced a desired set of circuit functions.

The basic feedforward network of 3-input lookup tables (3-LUTs) from the '327 invention is shown in FIG. 1. It is, as mentioned before, a periodic two-dimensional (planar) arrangement of an identical cell type. The three inputs of the cell of course are inputs to a 3-LUT. Here, we define LUTs as universal functions, which can be programmed to implement any of the $2^{(2^k)}$ possible functions of k inputs, with k=3 in this case. Though each cell has three outputs as well, it is important to note that the outputs are electrically identical (i.e., they are shorted together).

In the '788 patent, the concepts of the '327 patent were simplified through the introduction of periodic networks based on 2-LUTs. This configuration is illustrated in FIG. 2.

Molecular electronic approaches are based on forming electronic devices as a single molecule. Even as simple as the architectures described in '327 and '788 are, they require m-LUTs, where m is greater than or equal to two. Constructing a 2-LUT in a molecular synthesis process may be very difficult, and as the "arity" of the LUT is increased, the complexity of the LUT grows exponentially (i.e., a 3-LUT is twice as complex as a 2-LUT; a 4-LUT is twice as complex as a 3-LUT, etc.). Thus, since the cellular interconnection template defined between m-LUTs cannot be further reduced, then can the complexity of the computational block, the m-LUT itself, must be further simplified. Specifically, a non-LUT circuit can be substituted in the place of the LUTs shown in FIGS. 1 and 2.

In both previous inventions, the templates were assumed to contain fully programmable lookup tables. In terms of functional expressive capacity, LUTs are a "best case" situation, since k-LUTs can realize all $2^{(2^k)}$ Boolean functions. But even k-LUTs are complicated if the LUTs are to be built with current technologies, especially molecular approaches. In the present invention, every concept of these the '327 and '788 patents applies, except that the k-LUTs (where k may be 2 or greater) are replaced by circuits of lower complexity. In particular, an approach for creating simpler (but not fully expressive) k-LUTs based on 1-LUTs (as building blocks) is disclosed, capable ultimately of universal computation at the possible expense of efficiency when compared to larger LUT structures.

SUMMARY

In a preferred embodiment, the invention replaces the 3-input lookup tables (3-LUTs) of U.S. Pat. No. 6,215,327 and the 2-input lookup tables (2-LUTs) of U.S. Pat. No. 6,331,788. A preferred embodiment constitutes a computational network composed of 1-input lookup tables (1-LUTs).

Other aspects and advantages of the present invention will become apparent from the following detailed description, taken in conjunction with the accompanying drawing, illustrating by way of example the principles of the invention.

DETAILED DESCRIPTION

Figure 2:
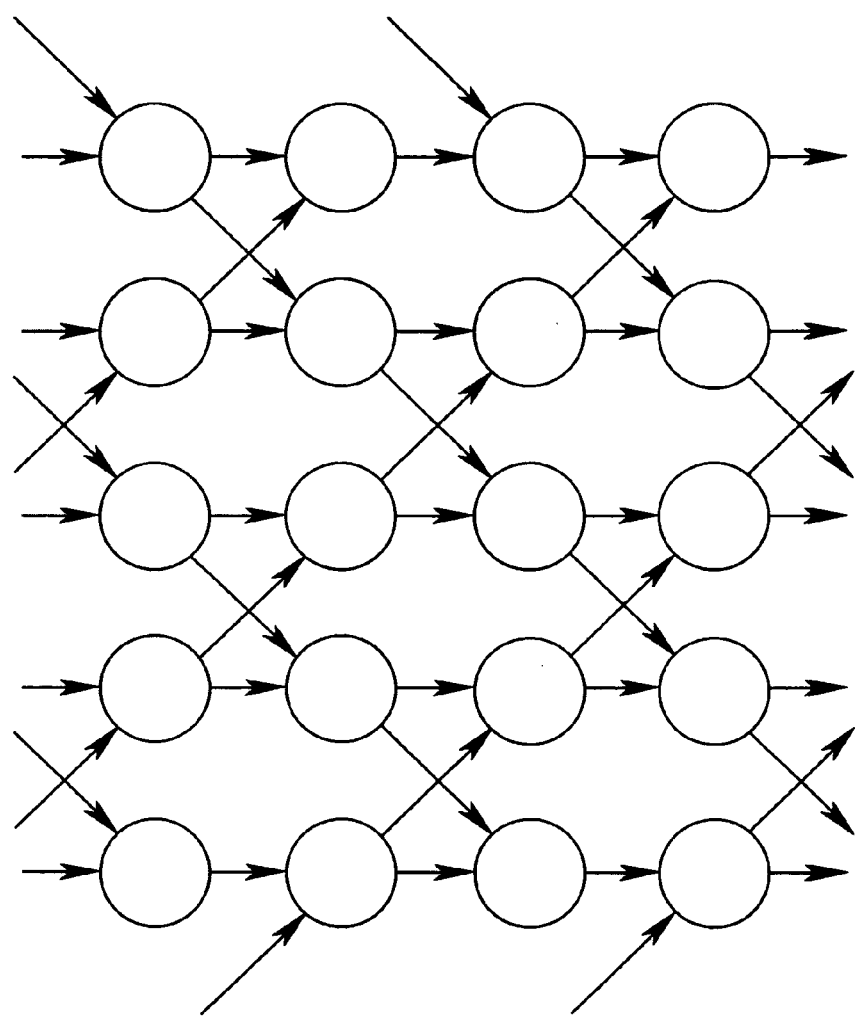
FIG. 2 illustrates a simpler feedforward network of 2-input lookup tables found in the prior art.

The present invention establishes a two-input, two-output circuit structure (the outputs are from the identical node) that may be substituted for the 2-LUTs that represent the circles in FIG. 2. The circuit structure is based on two elements: a one-input LUT (1-LUT) and a resistor. It is also a requirement that the 1-LUT have a finite input impedance for reasons that will be made clear.

Figure 3:
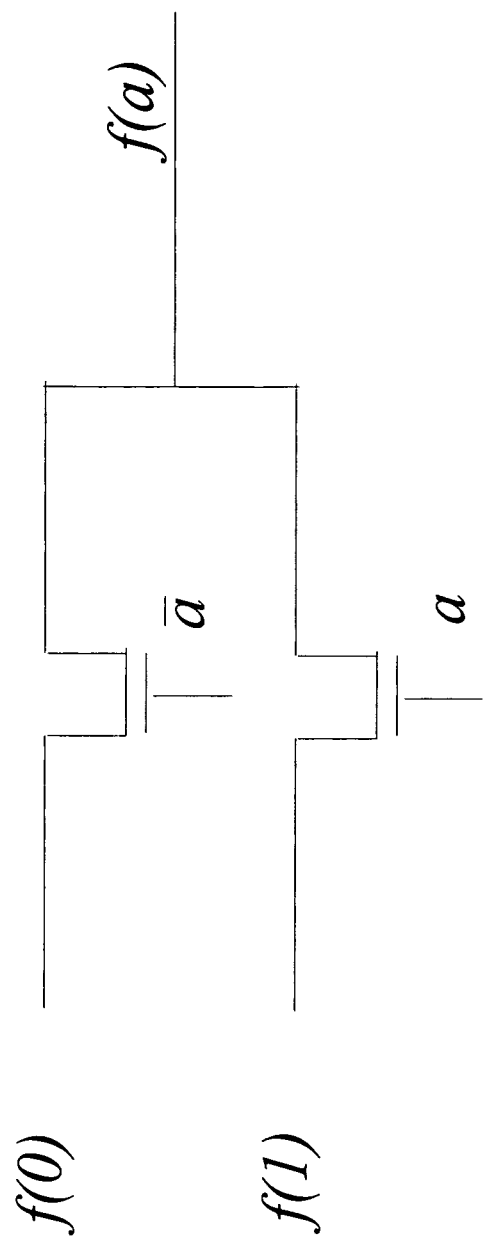
FIG. 3 illustrates the four possible configurations of a one-input lookup table (1-LUT).
Figure 4:
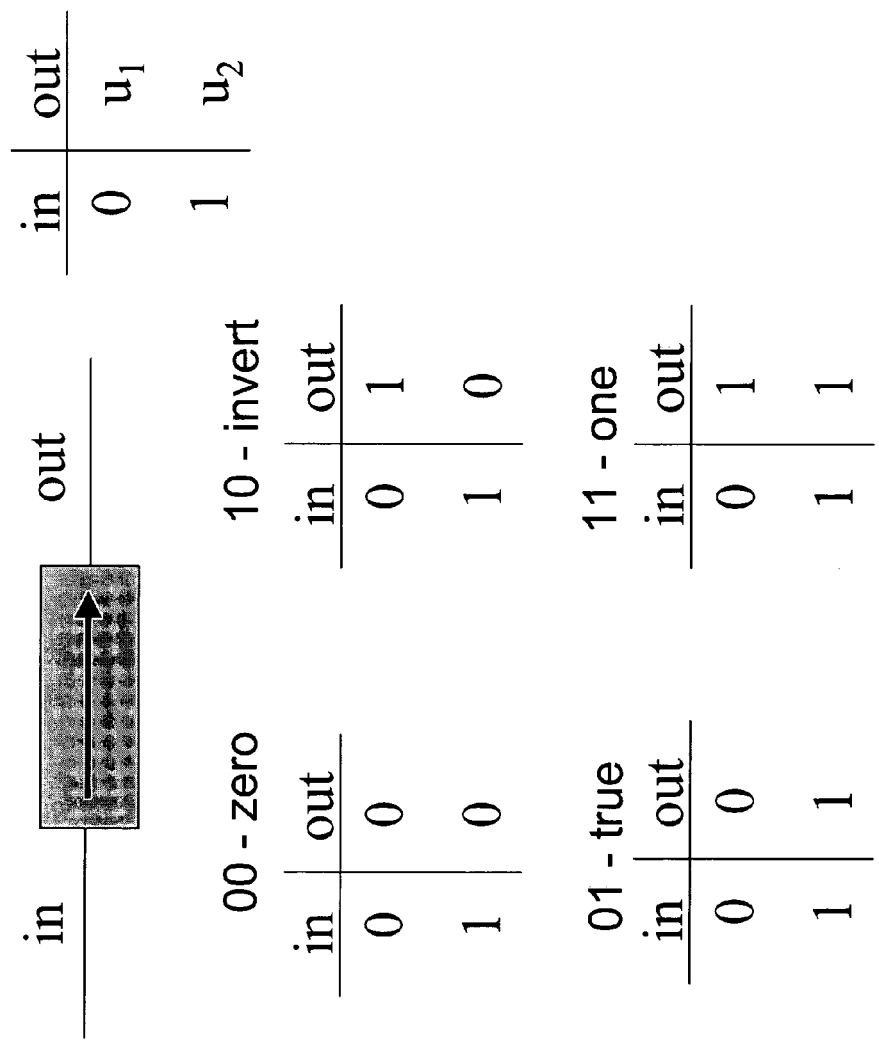
FIG. 4 illustrates a simplified VLSI implementation of a 1-LUT.

The 1-LUT is shown abstractly in FIG. 3 as a two terminal function, one terminal being input and one output. As a Boolean structure, the function can only have two values, one for when the input is set to logical zero (0) and one for when the input is set to logical one (1). The function of a 1-LUT, being programmable, can be drawn from a set of only four ($2^{2^1}$) possibilities, also shown in FIG. 3, which include zero, invert, true, and one. The 1-LUT can be implemented, like other LUTs and Boolean structures, in many ways. It can be represented as a Boolean equation $f(a)=a'*f0+a*f1$, where the prime (') indicates inversion, the asterisk a logical AND (*), and the plus sign (+) a logical OR. It can also be represented as a VLSI circuit, as shown in FIG. 4.

Figure 5:
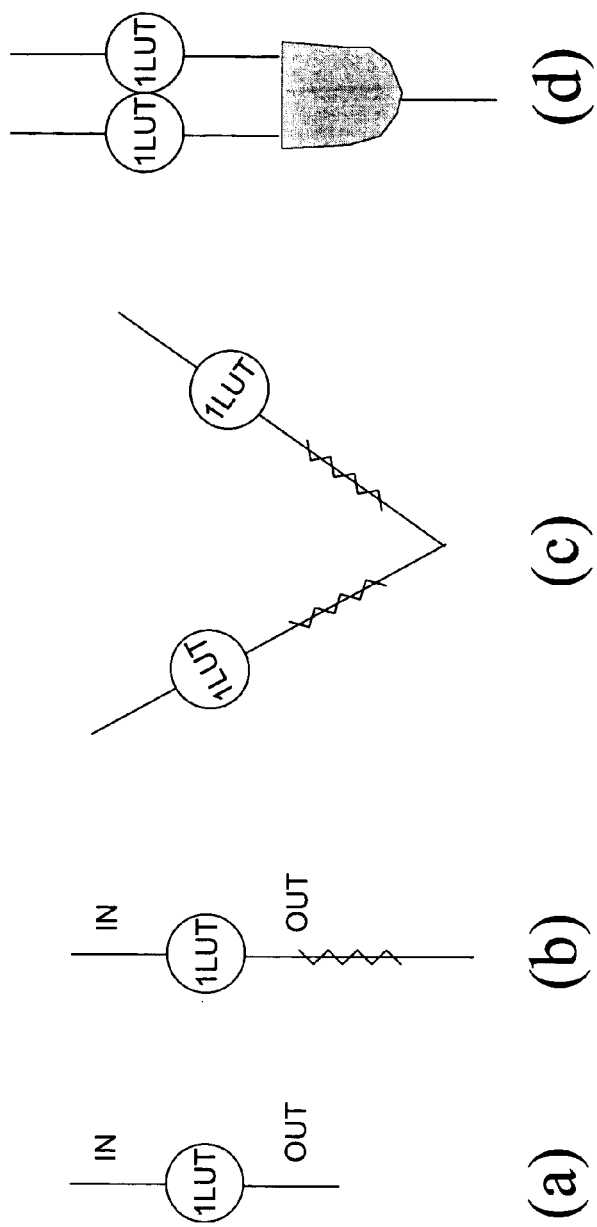
FIG. 5a illustrates a 1-LUT as a basic, two-terminal, Boolean function.
FIG. 5b illustrates a 1-LUT with a resistor in series.
FIG. 5c illustrates the conjunction of two 1-LUT elements with resistors in series.
FIG. 5d illustrates the AND gate potentially created from the conjunction illustrated in FIG. 5c.

Two 1-LUTs are then combined with resistors to form the basic circuit structure shown in FIG. 5a. A resistor is shown in series with the 1-LUT to form the structure in FIG. 5b. Two copies of this structure are conjoined as shown in FIG. 5c, which under certain conditions creates a logic gate, such as the AND gate suggested in FIG. 5d.

Figure 6:
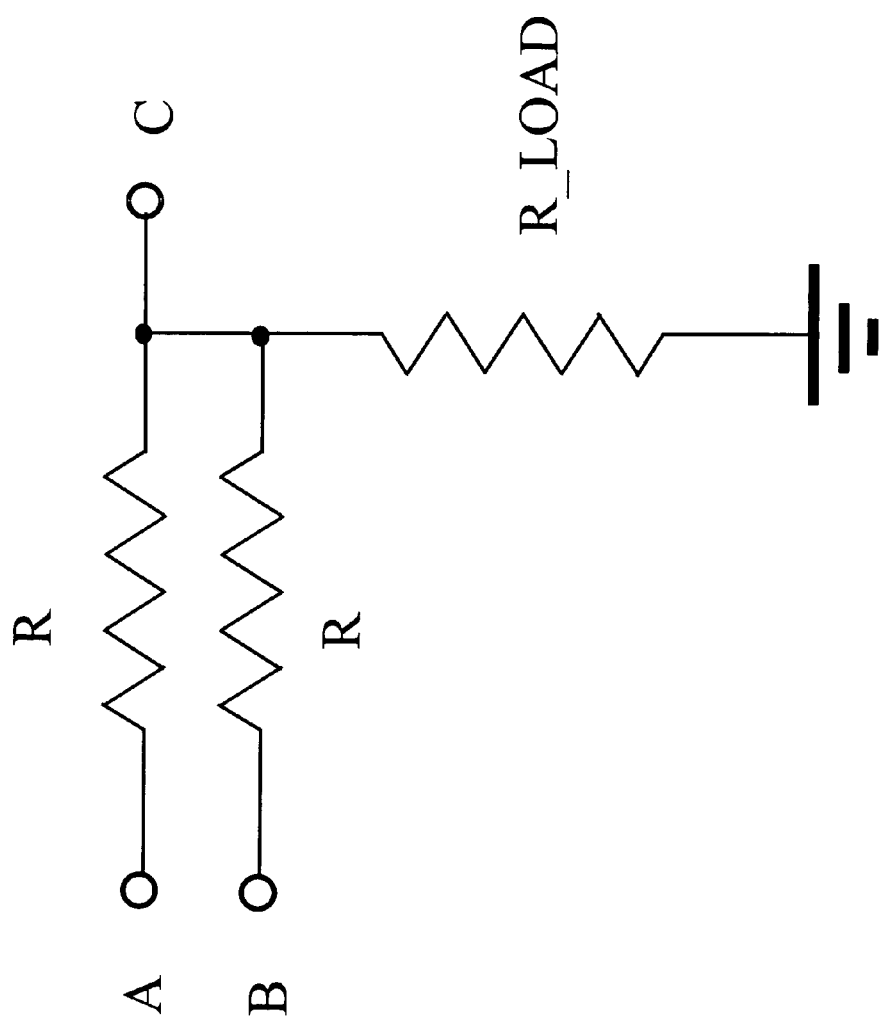
FIG. 6 illustrates a voltage divider which is formed by combining the 1-LUT elements having finite input impedance as seen in FIG. 5d.

The logic gate in FIG. 5d is realized as a by-product of the summing junction formed by the combination of the series resistors and a load resistor. The circuit configuration that gives rise to the "opportunistic" logic gate is shown in FIG. 6. A new resistor is shown in this FIG. (R_LOAD); this resistor represents the input impedance of the next circuit stage. It is a necessary condition that the input impedance (R_input) of the FIG. 5a structure be finite. When the FIG. 5c structures are connected in substitution of the circles in FIG. 2, then any particular output node must drive two more similar nodes. Hence, R_LOAD represents the parallel impedance of two stages, i.e. R_LOAD=R_input/2. Given such a network, it is possible to readily establish the output voltage ($V_C$) from ordinary circuit theory:

$$V_C = \frac{(V_A + V_B)}{(2 + R/R\_LOAD)}$$

As a logic gate, the FIG. 6 is a relatively fragile structure, and it is not generally able to produce logically useful behavior, such as an AND or an OR gate. To examine the optimum conditions for such logical behaviors, it is necessary to establish the parameters of a logic system under which these structures must operate and examine which (if any) values of R and R_LOAD will produce logical behavior. For this purpose, it is sufficient to define the ratio R/R_LOAD as a single parameter (r), and then examine the requirements for input and output voltage as they are affected by variations in this parameter. The necessary voltage definitions are as follows:

$V_{OH}$—The voltage output supplied to terminal A or B of FIG. 6, corresponding to the worst case (minimum) value of voltage corresponding to a logical one. This specifies the guaranteed lowest voltage corresponding to a logical one.

$V_{OL}$—The voltage output supplied to terminal A or B of FIG. 6, corresponding to the worst case (maximum) value of voltage corresponding to a logical zero. This specifies the guaranteed highest voltage corresponding to a logical zero.

$V_{IL}$—The highest value of voltage that in an input would be resolved as a logical zero. A voltage higher than this value is not guaranteed to be interpreted as a logical zero.

$V_{IH}$—The lowest value of voltage that in an input would be resolved as a logical one. A voltage falling below this value is not guaranteed to be interpreted as a logical one.

These definitions establish a logic system, workable under the assumption that (in this case) the 1-LUTs regenerate voltages as required to meet the $V_{OH}$ and $V_{OL}$ constraints. This regeneration, in general requires amplification or gain, but the details on how the amplification is achieved is not an important part of the present invention. Rather, it is necessary simply to show that the logical behavior of either an AND gate or an OR gate can be produced at all, which will be done with two simple examples.

Figure 7:
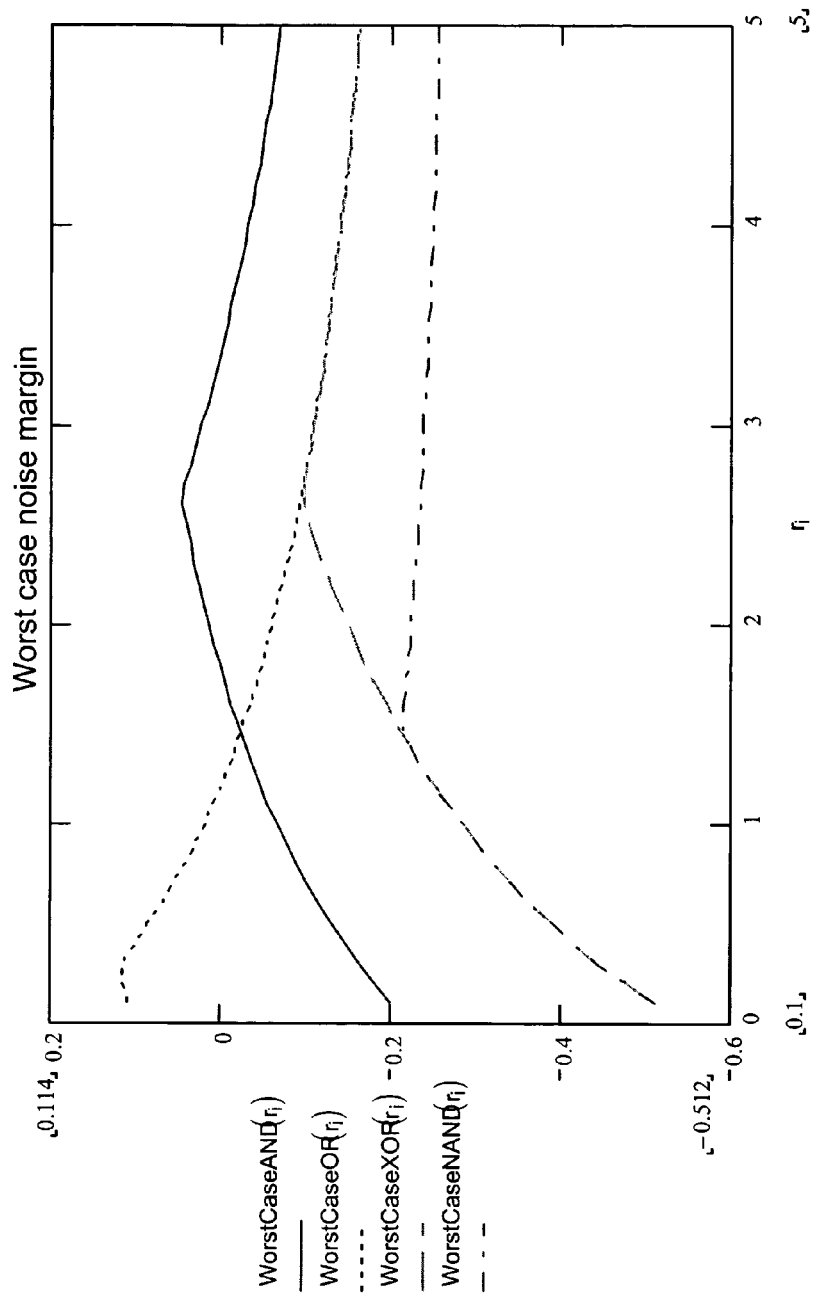
FIG. 7 shows a graphical analysis of the worst-case noise margin assuming the circuit shown in FIG. 6 behaves as an AND gate, and OR gate, and EXCLUSIVE-OR gate (XOR), or a NOT-AND gate (NAND).

Two examples are based on a nominally unit voltage approach, in which ideally logical 1=1 V and logical 0=0V. In real circuits, signals undergo degradation and it is necessary to make input circuits tolerant of noise. In the first example, the logic parameters $V_{OL}$=0.15, $V_{OH}$=0.8, $V_{IL}$=0.25, and $V_{IH}$=0.30. This is considered a workable but relatively poor logic system, due to the choice of input voltage span between logical 0 and logical 1. For these settings, the equation for Vc above is examined under the various input combinations associated with a two-input truth table. The graph in FIG. 7 is produced by examining the worst-case noise margin under the assumption that the FIG. 6 circuit behaves as an AND gate, OR gate and EXCLUSIVE-OR gate. In this graph, the ratio of R/R_LOAD=r is the independent variable. In this graph, only curves with positive noise margins are viable as a logic function. As shown in FIG. 7, both the AND gate and OR gate are potentially constructible at r-values of 2.64 and 0.275, respectively. Of the two functions, the OR gate has the better noise margin.

A second example employs the logic parameters $V_{OL}$=0.15, $V_{OH}$=0.8, $V_{IL}$=0.45, and $V_{IH}$=0.55. This selection might be considered a better choice for a language system since the input window is more centered within the output window, where the windows are defined as the span between the high and low voltages. The results, shown in FIG. 8, reveal that it is possible to produce only an AND gate behavior, which is maximal at an approximate r-value of 0.55.

Figure 9:
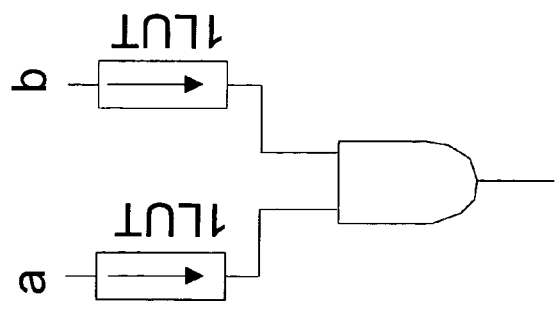
FIG. 9 shows a list of all functions computable with a two 1-LUT elements with AND gate combiner (2×1-LUT/AND cell).

A single FIG. 5c structure, when used to replace a 2-LUT in FIG. 2, is not capable of realizing all of the 2-input Boolean functions (there are 2^2^2=16 of these functions). FIG. 9 demonstrates all exhaustive combinations of the FIG. 5c structure, revealing that only 10 of the 16 possible Boolean functions are realized in this structure. In this case, an AND is shown as the combiner gate for the conjoined LUTs. It can be shown that substituting an OR gate for the AND gate (which could occur in some cases) does not change the number of realizable functions.

Since a system for universal computation must compute not only all functions of 2 inputs but also ultimately all functions of arbitrarily large input spaces, then it is necessary to demonstrate an approach to achieve these extensions. This is readily done by first showing the completion of the two-input space and then the extension to larger input spaces. All of these extensions take advantage of the well-known Shannon decomposition equation for logic:

$$f(x_1, x_2, x_3, \ldots x_n) = \overline{x_1}f(0, x_2, x_3, \ldots x_n) + x_1 f(1, x_2, x_3, \ldots x_n)$$

which in the case of a two-variable Boolean function becomes $$f(a,b) = \overline{a}f(0,b) + af(1,b)$$

Figure 10:
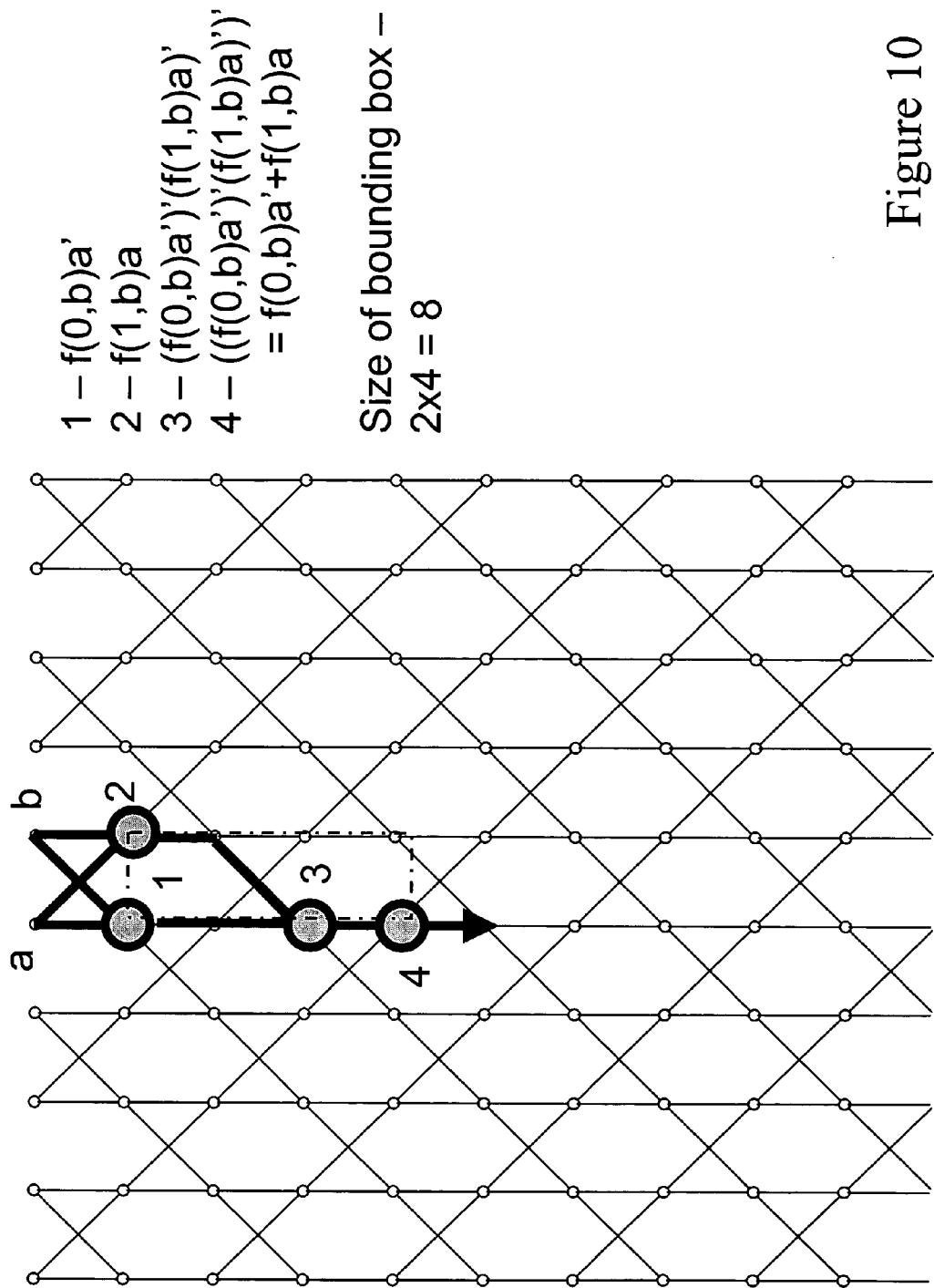
FIG. 10 illustrates a computational network based on 2×1-LUT/AND cells that is capable of computing all 16 Boolean functions of two variables.

Since f(0,b) and f(1,b) depend only on b, they may be replaced with 1-LUTs (though not generally the same 1-LUT function). It is straightforward to compose a 2-LUT from the FIG. 5d structures, and this construction is shown in FIG. 10. The bounding box is defined as the product of the minimum number of rows and columns required to implement a function in a grid similar to FIG. 1 or 2. In this case of course, the FIG. 10 grid is identical to the FIG. 2 grid in which each circle is replaced with the structures developed in FIG. 5d.

A bounding box is the minimum grid size (measured by the number or pitch of cells) necessary to contain a circuit. In this case, the bounding box size is eight (it is believed that this is a lower bound on the size of the box), which suggests that the new structures achieve flexibility at the price of efficiency. For this reason, the present invention is not considered an efficient way to build a programmable network in, for example, contemporary silicon VLSI, even though it would be quite simple to do so. Rather, the present invention is expected to find use in situations where only the most primitive building block structures are available and the disadvantage of inefficiency is offset by the advantage of establishing a practical way of performing computation. A prime example of a prospective medium in which this situation seems to exist today is molecular electronics, where the sheer density of molecules in matter is likely to offset inefficiencies of the type represented in this proposed invention, at least when the invention is compared to for example a contemporary silicon programmable logic array.

Figure 11:
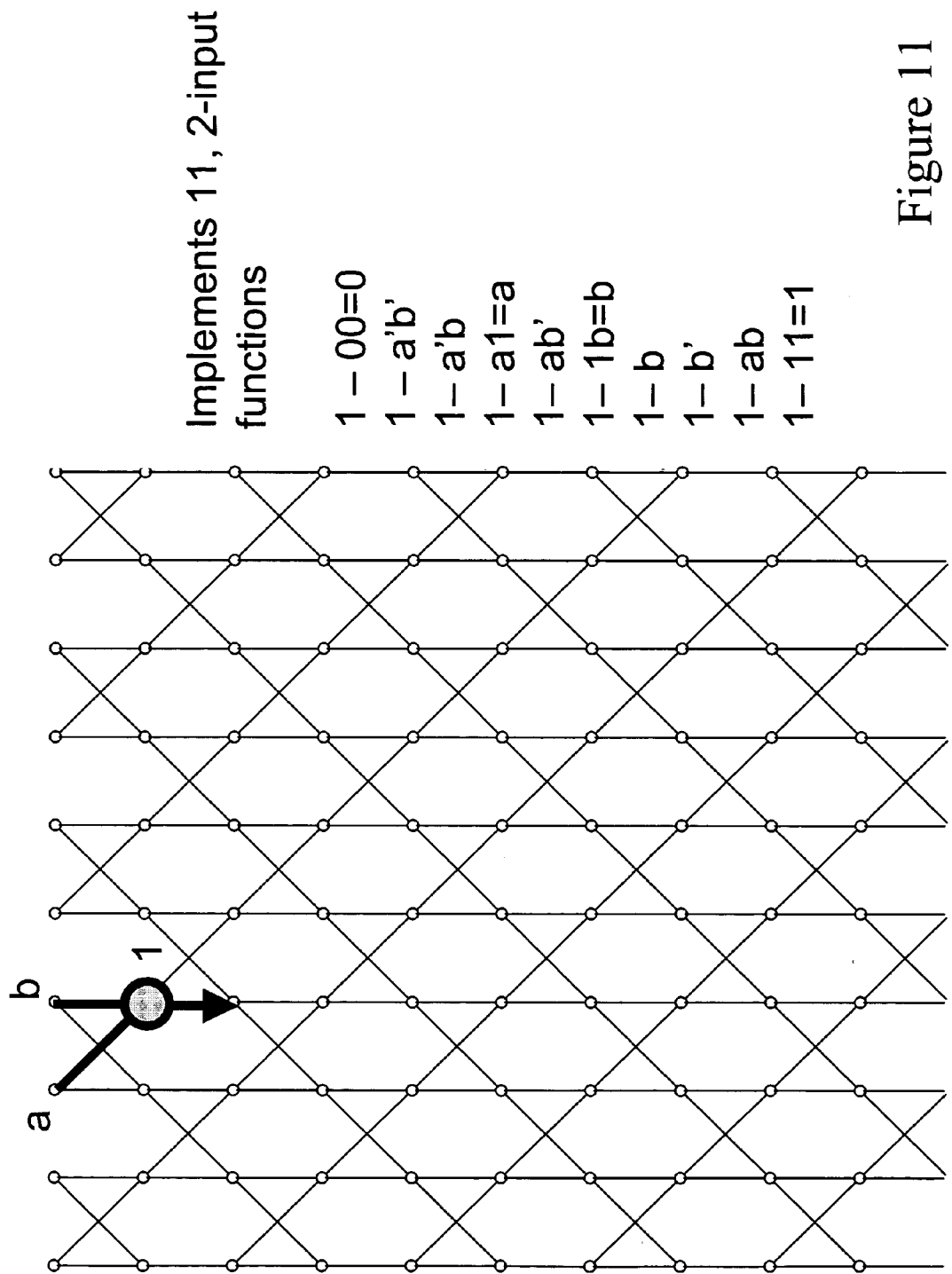
FIG. 11 illustrates a computational network based on 2×1-LUT/AND cells that is capable of computing 10 of the 16 Boolean functions of two variables.
Figure 12:
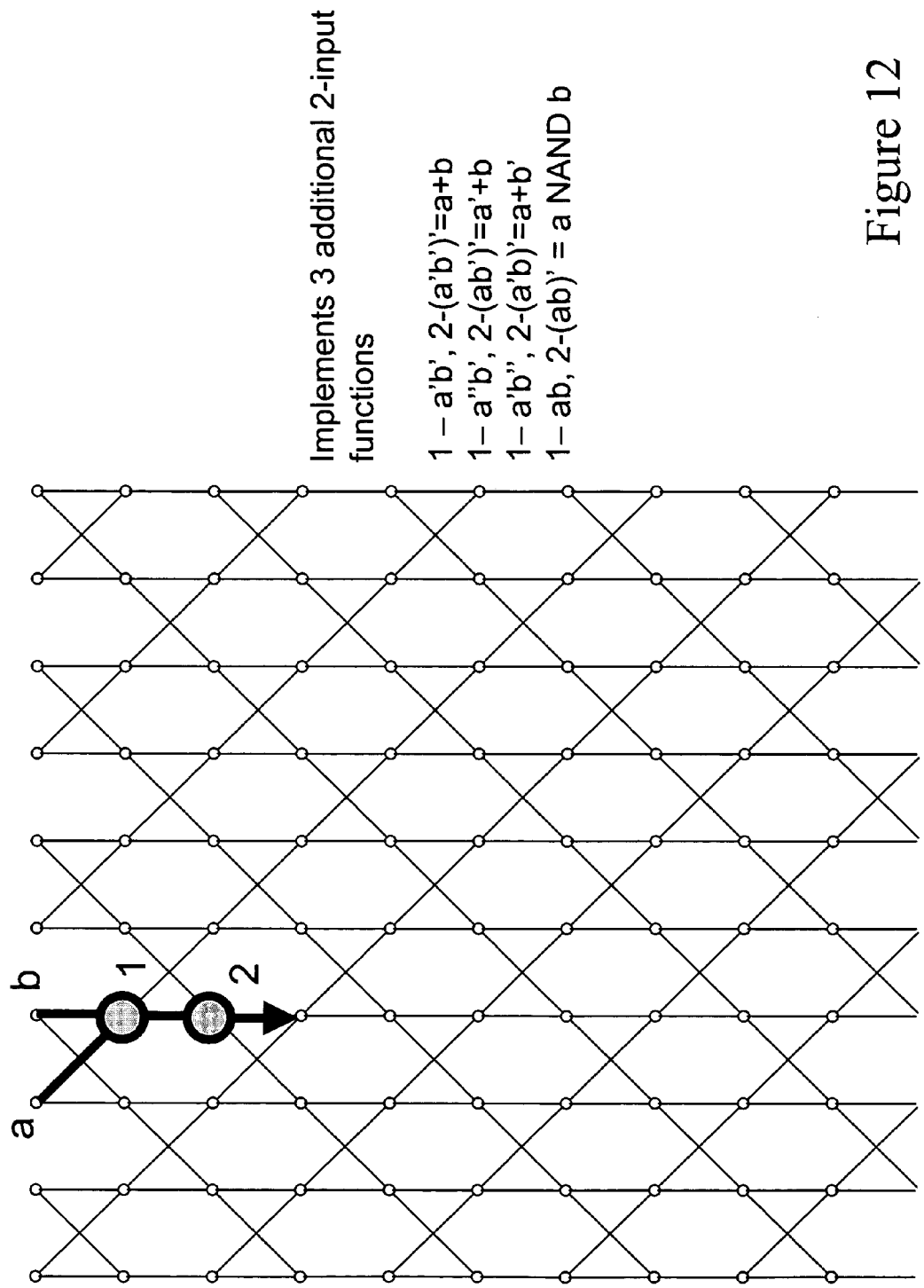
FIG. 12 illustrates a computational network based on 2×1-LUT/AND cells that is capable of computing 14 of the 16 Boolean functions of two variables.

It is also important to note that the bound shown in FIG. 10 is a worst case bound. Most of the 16 possible two-input functions can be realized with much smaller bounding boxes. As demonstrated in FIG. 11, ten of the 16 two-input Boolean functions can be realized with a bounding box size of 2, the minimum possible bounding box (only one actual cell of computation is required, but the box size is two due to the two inputs). In FIG. 12, increasing the bounding box size to four results in expanding the set of realizable two-input functions to 14. Only two of the 16 two-input Boolean functions, namely the XOR/XNOR or odd/even parity functions, require the maximal bounding box size, as shown in FIG. 10.

Again, for the work done in these completeness examples, the assumption of the AND gate for the conjoining function depicted in FIG. 5d is assumed. As shown in FIG. 7, it is possible to have OR gate behavior under certain conditions. It is on that basis, on consideration of duality, that all of these examples could equally be recreated using the OR gate instead of the AND gate.

Having shown the extension of the FIG. 5d structure to implement the complete set of two-input functions, it is necessary to show that functions of arbitrary size can also be implemented, so long as the dimensions of the bounding box are large enough. This can be done with a simple inductive proof, involving a base case and an induction step. The base case, the 2-LUT, has already been shown in FIG. 10. The induction step involves showing the construction of a (n+1)-LUT from n-LUTs, which involves once again Shannon's decomposition:

$$f(x_1, x_2, x_3, \ldots x_n) = \overline{x_{n+1}}f(x_1, x_2, x_3, \ldots x_n, 0) + x_{n+1}f(x_1, x_2, x_3, \ldots x_n, 1)$$

Figure 13:
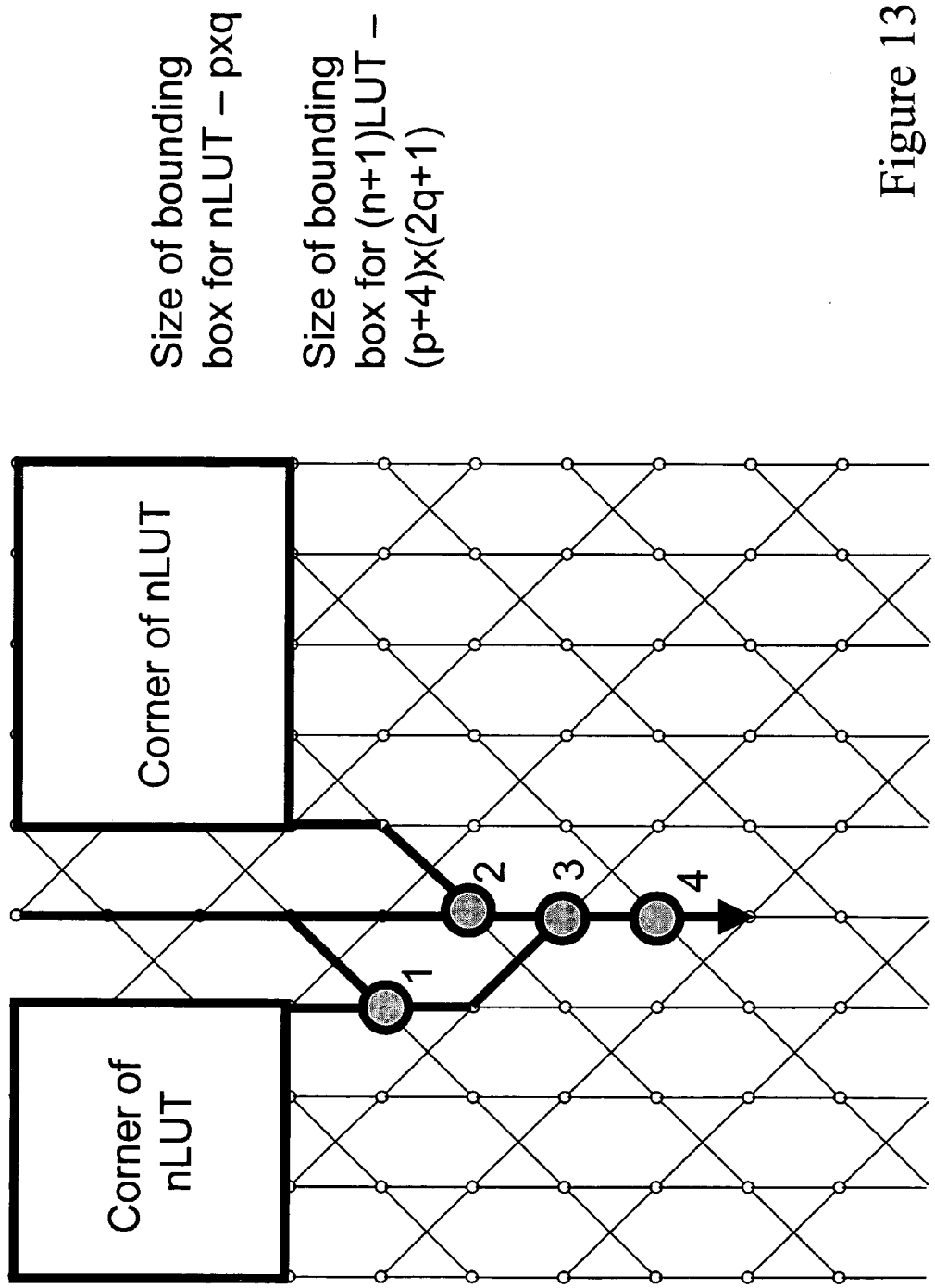
FIG. 13 illustrates the construction of a (n+1) 1-LUT network from n-LUTs.

This construction is shown in FIG. 13. If the bounding box of an n-LUT is p×q (p rows, q columns), then the resulting minimum bounding box is readily shown to be (p+4)×(2q+1). This construction not only completes the proof, but seems to establish a lower bound on the size growth of the bounding box with higher input dimensionality or "arity". It is in fact more involved than suggested in FIG. 13, since it is necessary to consider how the signal of the newly constructed LUT function must be routed, which will add to the number of rows required in a progressing of LUTs constructed from recursively simpler ones. Furthermore, the LUT brute force construction method of embedding smaller LUTs within larger ones is not the most efficient way of building LUTs, as suggested in a number of works in the field of circuit complexity field (see, for example, Ingo Wegener, *The Complexity of Boolean Functions*, copyrighted 1987 by John Wiley & Sons Ltd). Those works, while generally applicable to networks such as those shown in FIG. 1 and FIG. 2, have not been considered in light of the special constraints imposed by connectivity limitations of the network.

Figure 14:
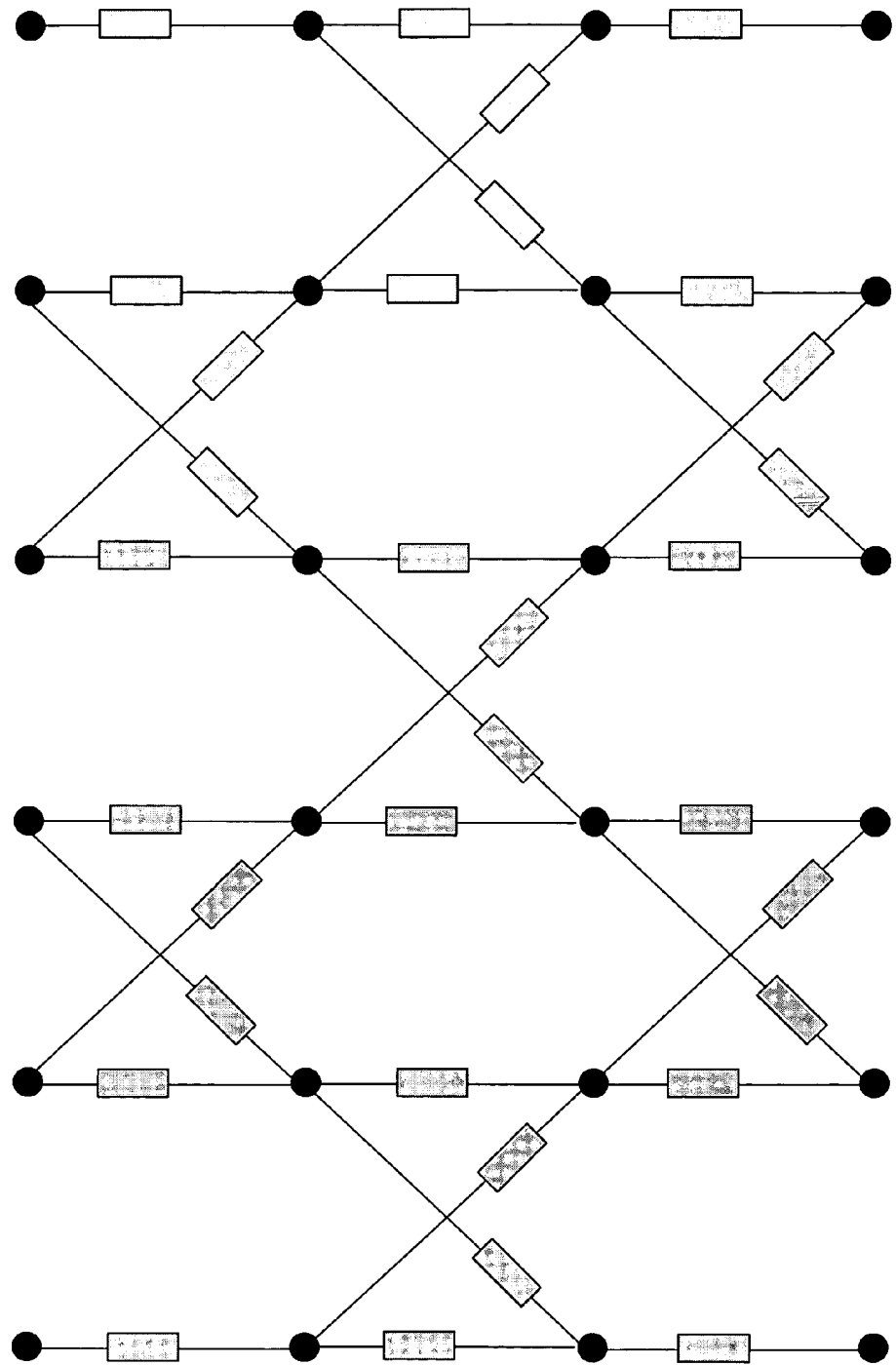
FIG. 14 illustrates a computational network as shown in FIG. 2 where the circles have been replaced by the cells as shown in FIGS. 5c/5d.

Extensions of the basic concept. One important property of a network based on FIG. 5b structures is that they form computation from a network of two-terminal (notwithstanding power, clock, and configuration connections) structures. FIG. 14 illustrates a representation of the FIG. 2 network, where the circles have been replaced by FIG. 5c structures, and the network is then "flattened" into a network of primitive structures. It is clear upon further reflection of this flattened network that many alternative arrangement of the FIG. 5b building blocks can be conceived.

Figure 15:
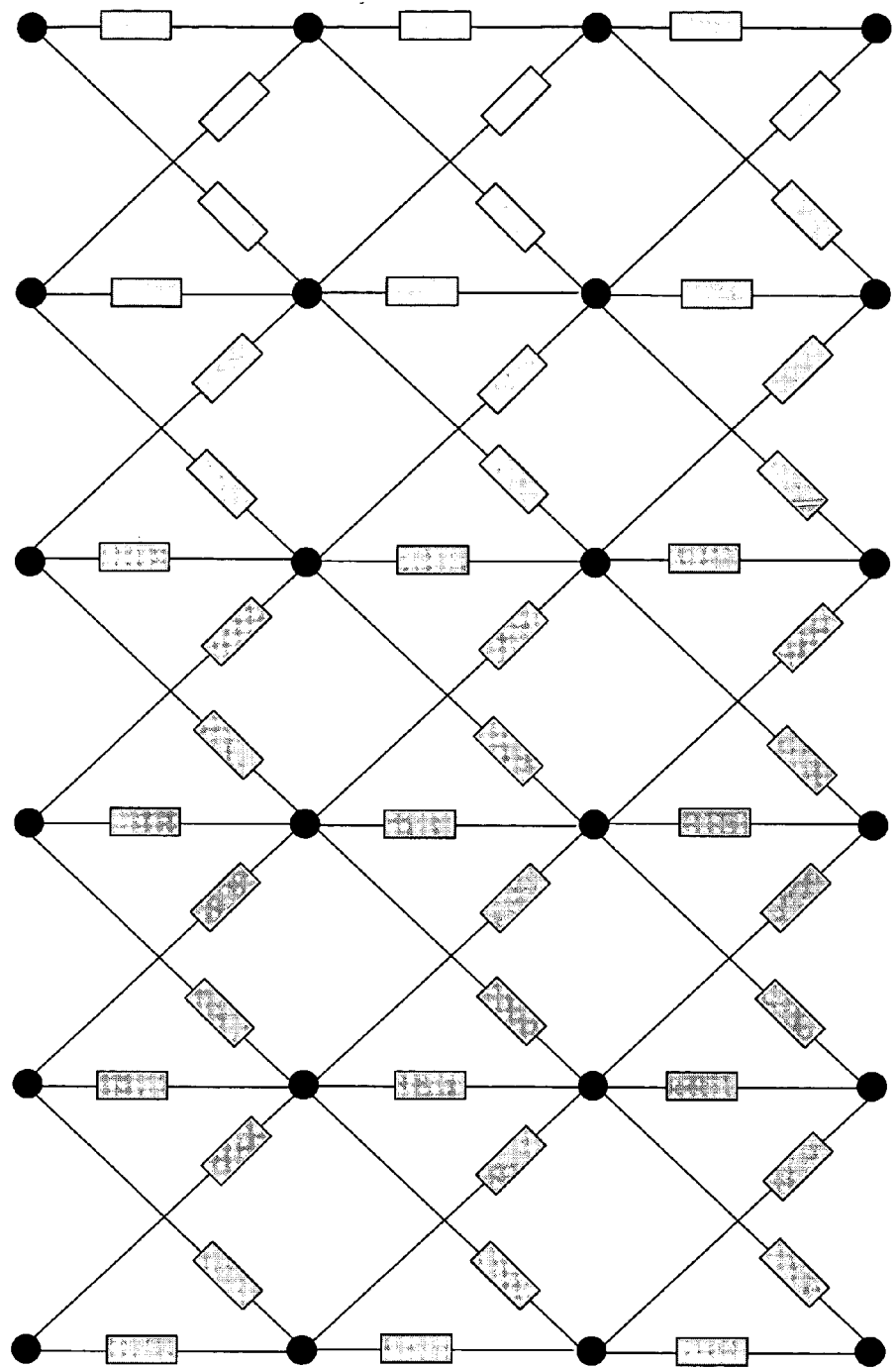
FIG. 15 illustrates a computational network as shown in FIG. 1 where the circles have been replaced by the cells as shown in FIGS. 5c/5d.

The resistive conjunction approach may be extrapolated to 3 or more elements, meaning that it may be possible to build 3-terminal, 4-terminal, or n-terminal structures by permitting more copies of the FIG. 5b to join together. Such arrangements may be convenient in processes whereby copies of the FIG. 5b network are formed through self-assembly, some easier to achieve than even the FIG. 14 network. For example, the FIG. 15 network possesses a greater symmetry than FIG. 14, and this network corresponds to the FIG. 1 network where the 3-LUT structures are replaced by a unit similar to FIG. 5c/FIG. 5d, but with three input terminals instead of two. Such networks would differ only in degree with those associated with the two-input/two-output networks described earlier.

Figure 8:
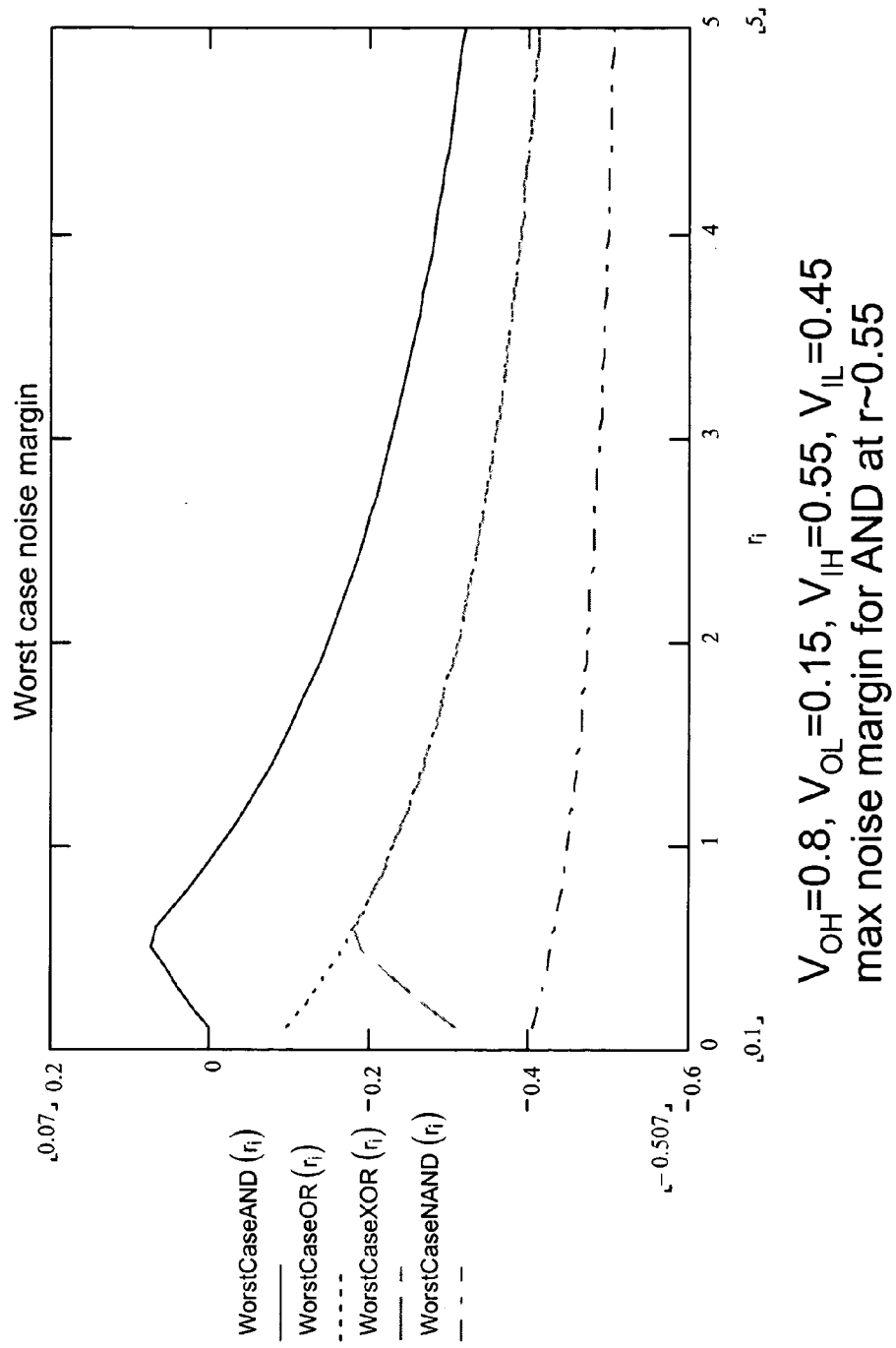
FIG. 8 shows another graphical analysis of the worst-case noise margins with modifications to the initial logic parameters.
Figure 16:
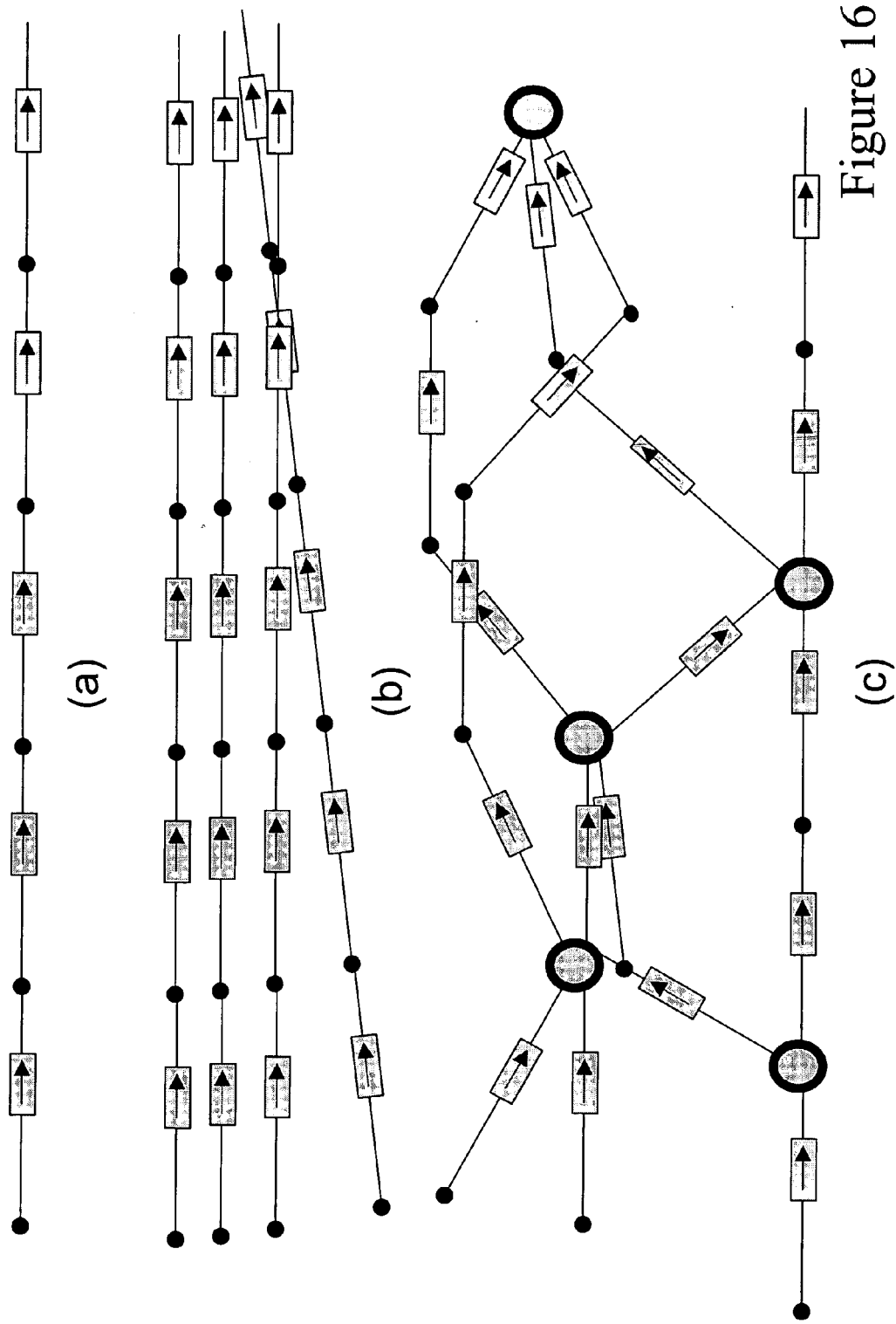
FIG. 16a illustrates a string of cells as shown in FIG. 5b, in a linear alignment.
FIG. 16b illustrates a plurality of linear strings as shown in FIG. 16a, placed alongside each other.
FIG. 16c illustrates an intertwined and randomized geometry of strands as shown in FIG. 16b, to create an amorphous computational network.

The notion of conjoining a variable number of FIG. 5b structures has great potential in building computing structures that are more defect tolerant. The addition of a spurious element or the vacancy of an element need not have a disastrous impact on functionality even at a localized level. Far more important is the possibility of exploiting the technique in the formation of amorphous computation networks. One technique for realizing such a network is suggested in FIG. 16. This concept is based on a technique for building a linear strand of FIG. 5b elements, in which a number of copies follow one after another in a one-dimensional repetitive structure (FIG. 16a). A number of such strands might be placed alongside each other as shown in FIG. 16b. Under some circumstance it might be possible that the strands would intertwine with a somewhat randomized geometry. With no particular pattern, some junctions of one strand might connect to junctions on other strands, forming a network that has localized structures such as those shown in FIG. 5c with one, two, or more strands participating at any given point. In fact, even a non-stranded format, a number of loose individual structures in the FIG. 5b construction might be permitted to self-organize into random arrangements. These random arrangements would contain elements that would co-join, once again forming an amorphous computation network. To be accurate in effectively designing circuits with such networks, it would be necessary to perform a number of the analyses as shown in FIG. 7 and FIG. 8 to confirm which of the opportunistic m×1-LUT networks so formed would effectively operate as logic structures, programmable or not. It is likely a necessary condition that most of the opportunistic LUT structures do not decrease the effective expressive capacity of the overall amorphous computing network.

Figure 1:
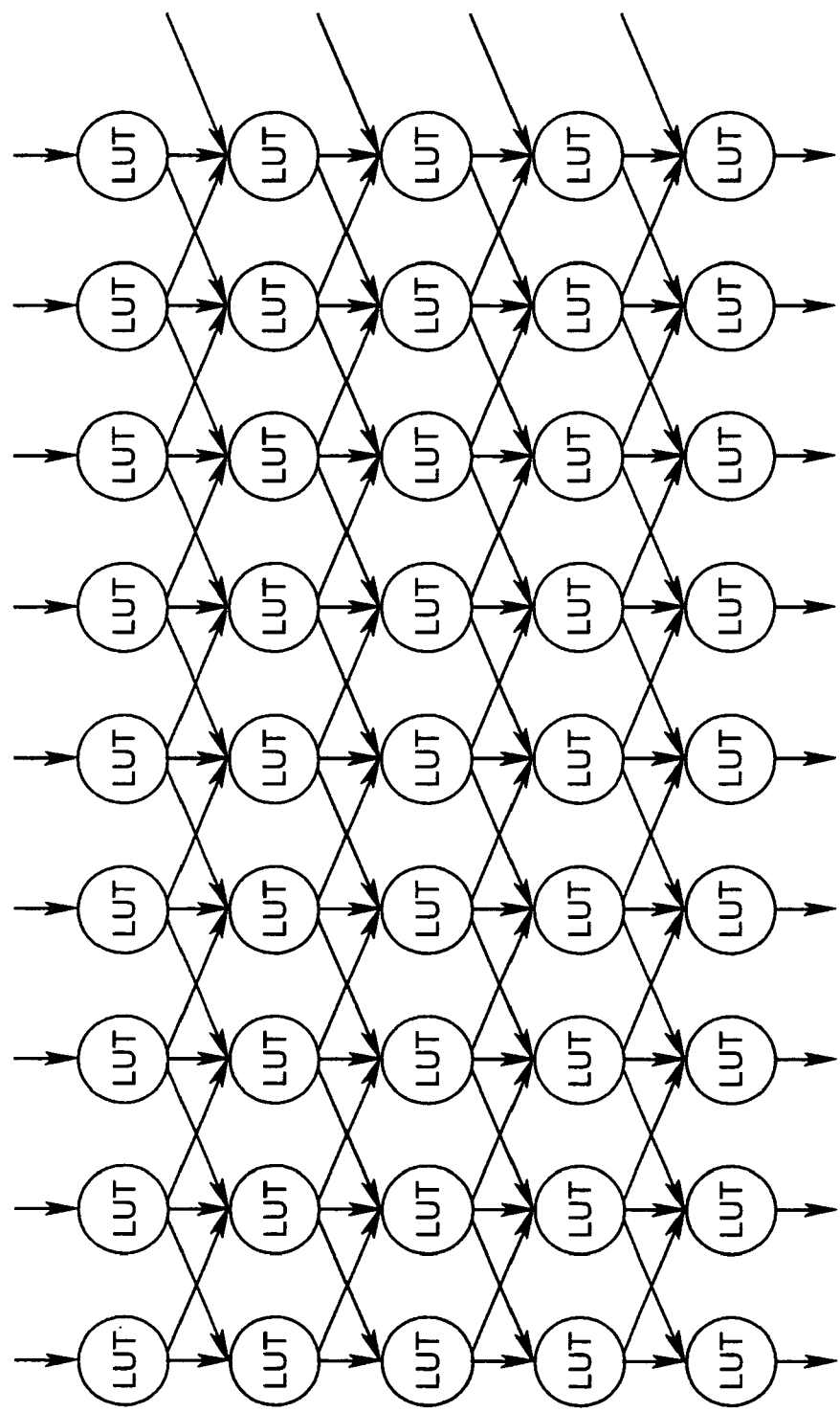
FIG. 1 illustrates the basic feedforward network of 3-input lookup tables found in the prior art.

The advantage of the proposed invention is that it leads to simpler constructions for the building blocks within the architectures, shown in FIGS. 1 and 2 as circles. The disadvantage is that the size of the network in general must be larger to accomplish the same types of functions, which is due to the lack of universality of a single cell (FIG. 5d). The lack of universality is solved by adding other cells, resulting in a need to expand the network size.

What is claimed is:

1. A field programmable gate array having 1-input Boolean lookup table-based architecture comprising:

one or more arrays, each said array comprising a plurality of cells arranged in a directed, repeatable x-column, y-row grid propagating in the positive y direction, with each said cells having only nearest neighbor connections to other cells and not any other bridging structures except at the boundaries, the definition of each cell behavior in an array being allowed to be distinct and individually programmable for a particular logic function;

each said cell being identical and having identical connection geometries, and each said cell further comprising two independent 1-input look tables, with each of said independent 1-input lookup tables having a dedicated resistor in series, and each said cell having a separate output;

each of said arrays having no specialized routing structures, since logic functions can imitate wiring from any lookup table input to an output, allowing the lookup table to emulate both logic and virtual wiring; and periodic, alternating neighborhood templates in both horizontal and vertical directions for all lookup tables in a particular array.

2. A field programmable gate array having 1-input Boolean lookup table-based architecture comprising one or more arrays, each said array comprising a plurality of cells arranged in a random structure, each said cell being identical and having identical connection geometries, and each said cell further comprising two independent 1-input lookup tables, with each of said independent 1-input lookup table having a dedicated resistor in series, and each said cell having a separate output.

* * * * *